United States Patent
Hirata

Patent Number: 5,966,397
Date of Patent: Oct. 12, 1999

[54] SELF-PULSATING SEMICONDUCTOR LASER

[75] Inventor: Shoji Hirata, Kanagawa, Japan

[73] Assignee: Sony Corporation, Tokyo, Japan

[21] Appl. No.: 08/972,768

[22] Filed: Nov. 18, 1997

[30] Foreign Application Priority Data

Nov. 19, 1996 [JP] Japan .................................. 8-308531

[51] Int. Cl.$^6$ ...................................................... H01S 3/19
[52] U.S. Cl. ................................ 372/46; 372/43; 372/44; 372/45
[58] Field of Search ................................ 372/45, 46, 43, 372/44

[56] References Cited

U.S. PATENT DOCUMENTS

| | | | |
|---|---|---|---|
| 5,311,534 | 5/1994 | Mori et al. ................................ | 372/46 |
| 5,523,256 | 6/1996 | Adachi et al. ........................... | 437/129 |

FOREIGN PATENT DOCUMENTS

| | | |
|---|---|---|
| 5-299770 | 11/1993 | Japan . |
| 7-45902 | 2/1995 | Japan . |

OTHER PUBLICATIONS

Patent Abstracts of Japan, vol. 9, No. 240 (1985) JP60–089991 (Fujitsu) (May).

Appl. Phys. Lett. 61, "Antiresonant reflecting optical waveguide–type single mode diode lasers", Aug. 1992, No. 5, New York, US, Mawst et al.

IEEE Journal of Quantum Electronics, "A real–index guided InGaAlP visible laser diode with a small beam astigmatism", (Jun. 27, 1991) No. 6, Okajima et al.

Primary Examiner—Rodney Bovernick
Assistant Examiner—Sung T. Kim
Attorney, Agent, or Firm—Hill & Simpson

[57] ABSTRACT

A semiconductor laser includes an n-type GaAs current blocking layer formed at both sides of a stripe portion made of an upper-lying portion of a p-type AlGaInP cladding layer, p-type GaInP intermediate layer and p-type GaAs cap layer to form a current blocking structure, and the p-type AlGaInP cladding layer has a thickness $d_1$ at both sides of the stripe portion and a thickness $d_2$ outside them $(0<d_1<d_2)$ to effect optical guide by transversely changing refractive indices. In this case, the semiconductor laser has a refractive index $n_1$ in the stripe portion, a refractive index $n_2$ at both sides of the stripe portion, and a refractive index $n_3$ in further outer sides $(n_2<n_3<n_1)$. Width $W_G$ of a gain region inside a GaInP active layer and width $W_P$ of an optical guide region $(W_G<W_P)$ are controlled independently, and a saturable absorbing region with a sufficient area is ensured.

8 Claims, 4 Drawing Sheets

SELF-PULSATING SEMICONDUCTOR LASER

BACKGROUND OF THE INVENTION

1. Field of the Invention

This invention relates to a self-pulsation semiconductor laser.

2. Description of the Related Art

For using a semiconductor laser as a light source of an optical disc device, or the like, it is important to find how to suppress noise caused by return light. A known approach for suppressing return light noise is to use a so-called self-pulsation semiconductor laser configured to oscillate by self-excitation to cope with multi-mode operation. FIG. 1A is a cross-sectional view of such a conventional self-pulsation semiconductor laser. The self-pulsation semiconductor laser operative is shown here as being made of AlGaInP-based materials.

As shown in FIG. 1A, the conventional AlGaInP-based self-pulsation semiconductor laser is made by sequentially stacking on an n-type GaAs substrate 101 an n-type AlGaInP cladding layer 102, GaInP active layer 103, p-type AlGaInP cladding layer 104, p-type GaInP intermediate layer 105, and p-type GaAs cap layer 106. An upper-lying portion of the p-type AlGaInP cladding layer 104, p-type GaInP intermediate layer 105 and p-type GaAs cap layer 106 are made in a mesa-type stripe configuration extending in one direction. Numeral 107 denotes the stripe portion including the upper-portion of the p-type AlGaInP cladding layer 104, p-type GaInP intermediate layer 105 and p-type GaAs cap layer 106. Buried at both sides of the stripe portion 107 is an n-type GaAs current blocking layer 108 to thereby form a current blocking structure.

Formed on the p-type GaAs cap layer 106 and the n-type GaAs current blocking layer 108 is a p-side electrode 109 made of, for example, Ti/Pt/Au. On the other hand, an n-side electrode 110 made of AuGe/Ni/Au, for example, is formed on the bottom surface of the n-type GaAs substrate 101.

FIG. 1B is a schematic diagram showing distribution of refractive indices of the conventional AlGaInP-based self-pulsation semiconductor laser. In this diagram, distribution of refractive indices of the AlGaInP-based self-pulsation semiconductor laser, in a particular direction parallel to the p-n junction of and normal to the cavity lengthwise direction (the particular direction is hereinafter referred to as the transverse direction), is shown in a correspondence with FIG. 1A.

That is, as shown in FIG. 1B, the conventional AlGaInP-based self-pulsation semiconductor laser exhibits step-shaped distribution of refractive indices in the transverse direction in which the refractive index $n_1'$ at the portion corresponding to the stripe portion 107 and the refractive index $n_2^{1'}$ at the portion corresponding to both sides of the stripe portion 107. In the conventional self-pulsation semiconductor laser, the transverse optical guide is effected by stepwise changing its transverse refractive index. In this case, the refractive index difference $\Delta n'(=n_1'-n_{22}')$ between the the portion corresponding to the stripe portion 107 and the portion corresponding to both sides of the stripe portion 107 is chosen to be approximately 0.0003 or less, which is nearer to the value of a gain-guided semiconductor laser, 0, than the typical value of an ordinary real-index-guided semiconductor laser, 0.001. In this manner, the transverse optical confinement of the GaInP active layer 103 is made moderate.

During operation of the conventional self-pulsation semiconductor laser of this type, the width $W_P'$ of the optical guide region 112 relative to the width $W_G'$ of the gain region 111 in the GaInP active layer 103 becomes large, and a part of the optical guide region 112 outside the gain region 111 becomes a saturable absorbing region 113. In the conventional self-pulsation semiconductor laser, self-pulsated oscillation is realized by reducing the change in transverse refractive index to increase the extruded amount of transverse light and to enhance interaction between the light and the saturable absorbing region 113 inside the GaInP active layer 103. Therefore, it is important to make a sufficient area of the saturable absorbing region 113.

In the above-indicated conventional self-pulsation semiconductor laser, however, the extension of the saturable absorbing region 113 is determined by a small difference between the width $W_G'$ of the gain region 111 and the width $W_P'$ of the optical guide region 112 inside the GaInP active layer 103, and the following problem has been involved.

That is, in the conventional self-pulsation semiconductor laser, extension of electric current and extension of light in the transverse direction are controlled by precise control of the thickness d' of the p-type AlGaInP cladding layer 104 underlying the both sides of the stripe portion 107, which results in determining the width $W_G'$ of the gain region 111 and the width $W_P'$ of the optical guide region 112. However, since the thickness d' of the p-type AlGaInP cladding layer 104 underlying the both sides of the stripe portion 107 is liable to vary when it is fabricated, the yield of products acceptable for self-pulsated oscillation is low.

Moreover, when the conventional self-pulsation semiconductor laser is operated at a high temperature or for a high output power, self-pulsated oscillation is suppressed due to an excessive transverse extension of the electric current and a reduction of the saturable absorbing region 113.

OBJECTS AND SUMMARY OF THE INVENTION

It is therefore an object of the invention to provide a self-pulsation semiconductor laser which can be manufactured with a high yield and ensures reliable self-pulsated oscillation even during operation at a high temperature or for a high output power.

According to the first aspect of the invention, there is provided a semiconductor laser having a refractive index distribution in a direction parallel to a p-n junction thereof and normal to the cavity lengthwise direction thereof, comprising:

a substrate;

a first cladding layer formed on the substrate;

an active layer formed on the first cladding layer;

a second cladding layer formed on the active layer;

the second cladding layer including a stripe portion; and a current blocking layer formed on both sides of said stripe portion, the refractive index distribution including a first refractive index portion having a first refractive index in the stripe portion, a second refractive index portion having a second refractive index lower than the first refractive index at both sides of the stripe portion, and a third refractive index portion having a third refractive index not higher than the first refractive index and higher than the second refractive index outside the second refractive index portion.

According to the invention having the above-indicated structure, its refractive index distribution in a direction parallel to the p-n junction and normal to the cavity lengthwise direction includes a first index portion having a first refractive index in the stripe portion, a second index portion having a second refractive index lower than the first refractive index at both sides of the stripe portion, and a third index portion having a third refractive index not larger than the first refractive index and higher than the second refractive index outside the second index portion. Therefore, light from the active layer is pulled by the third index portion and can extend sufficiently. As a result, extension of light in the direction parallel to the p-n junction and normal to the cavity lengthwise direction becomes larger than the width of the stripe. On the other hand, due to the current blocking structure, extension of electric current in the direction parallel to the p-n junction and normal to the cavity lengthwise direction is restricted approximately to the width of the stripe. Therefore, the width of the gain region inside the active layer becomes smaller than the width of the optical guide region, and the optical guide region outside the gain region behaves as the saturable absorbing region. In this case, since current confinement and light confinement in the direction parallel to the p-n junction and normal to the cavity lengthwise direction can be effected independently, the saturable absorbing region can be reliably grown sufficiently.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention are described below with reference to the drawings.

Figure 1A:
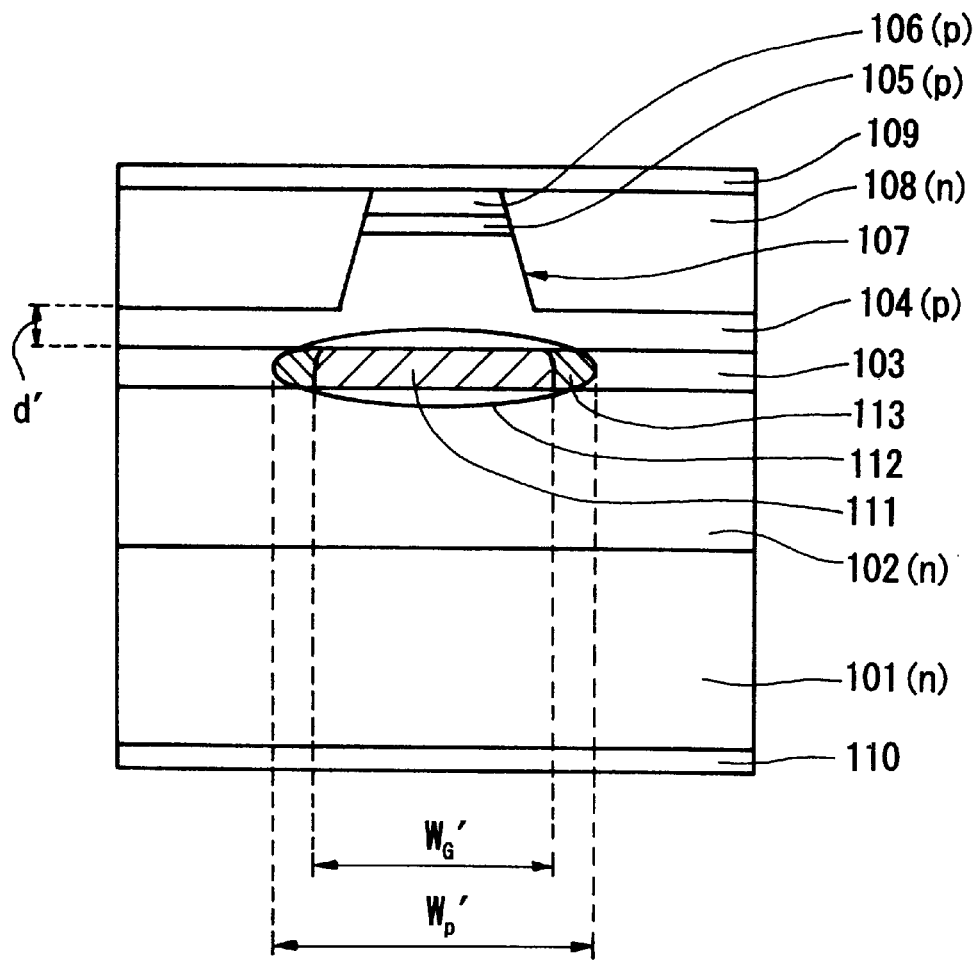
FIGS. 1A and 1B are a cross-sectional view showing a conventional AlGaInP-based self-pulsation semiconductor laser and a schematic diagram showing distribution of refractive indices of the self-pulsation semiconductor laser.
Figure 1B:
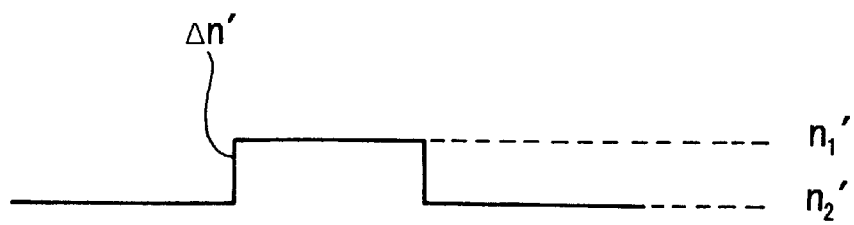
Figure 2A:
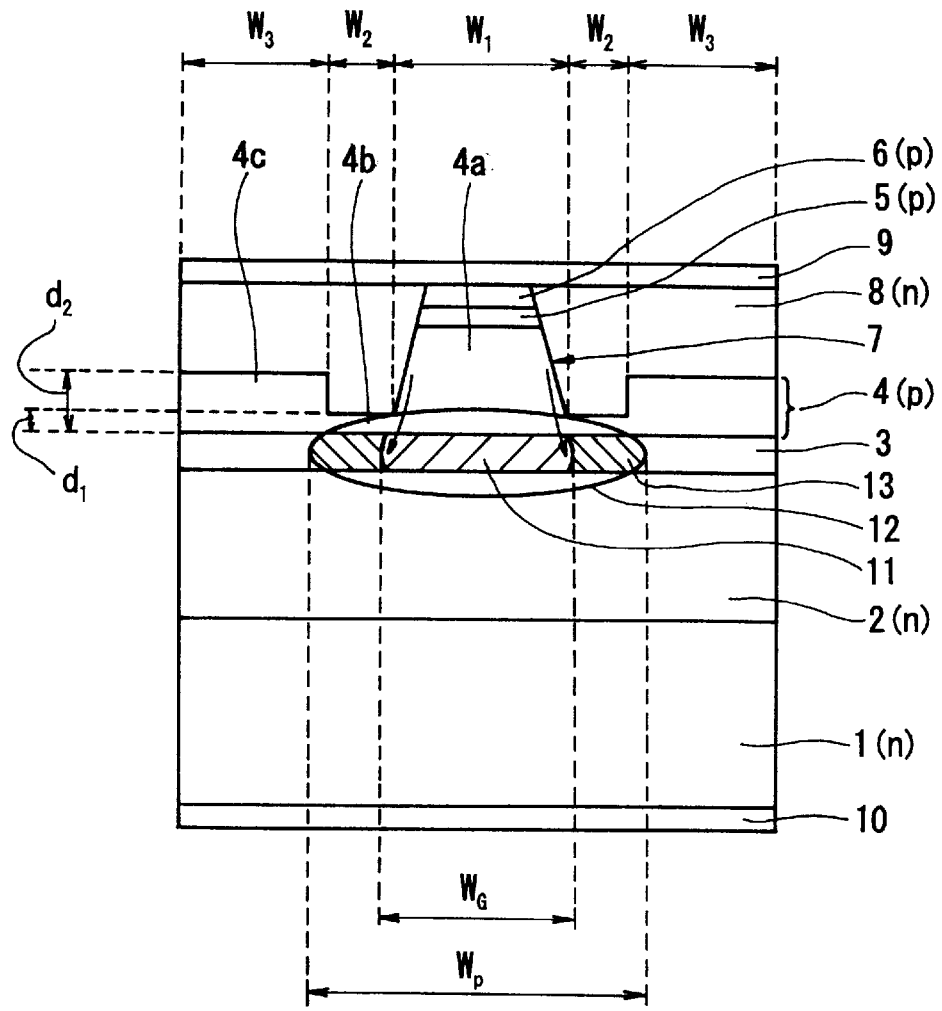
FIGS. 2A and 2B are a cross-sectional view showing an AlGaInP-based self-pulsation semiconductor laser according to the first embodiment of the invention and a schematic diagram showing distribution of refractive indices of the self-pulsation semiconductor laser.

FIG. 2A is a cross-sectional view showing a self-pulsation semiconductor laser according to the first embodiment of the invention. The self-pulsation semiconductor laser is explained here as being made of AlGaInP-based materials.

The AlGaInP-based self-pulsation semiconductor laser according to the first embodiment includes, as shown in FIG. 2A, an n-type AlGaInP cladding layer 2, GaInP active layer 3, p-type AlGaInP cladding layer 4, p-type GaInP intermediate layer 5 and p-type GaAs cap layer 6 sequentially stacked on an n-type GaAs substrate 1. The upper portion of the p-type AlGaInP cladding layer 4, p-type GaInP intermediate layer 5 and p-type GaAs cap layer 6 are made to form a stripe extending in one direction. Numeral 7 denotes the stripe portion made of the upper portion of the p-type AlGaInP cladding layer 4, p-type GaInP intermediate layer 5 and p-type GaAs cap layer 6. The stripe portion 7 has a mesa-type cross-sectional configuration.

Formed in the p-type AlGaInP cladding layer 4 are depressed portions along both sides of the stripe portion 7. Region 4a is a part of the p-type AlGaInP cladding layer 4 forming the stripe portion. Regions 4b are parts of the p-type AlGaInP cladding layer adjacent the both sides of the region 4a and forming the depressed portions. Regions 4c are parts thereof outside the regions 4b when viewed from the light emitting center.

Dimensions $W_1$, $W_2$ and $W_3$ represent transverse widths of the regions 4a, 4b and 4c of the p-type AlGaInP cladding layer 4. In this case, the width $W_1$ of the region 4a is the width of the stripe. Dimensions $d_1$ and $d_2$ are thicknesses of the regions 4b and 4c of the p-type AlGaInP cladding layer 4. The thickness $d_1$ of the region 4b of the p-type AlGaInP cladding layer 4 is smaller than the thickness $d_2$ of the region 4c. In other words, the p-type AlGaInP cladding layer 4 is made such that the thickness $d_1$ at the both sides of he stripe portion 7 (at regions 4b) is smaller than the thickness $d_2$ at the outer portions thereof (at the regions 4c) ($0<d_1<d_2$).

An n-type GaAs current blocking layer 8 is stacked to fill both sides of the stripe portion 7 made of the upper portion of the p-type AlGaInP cladding layer 4, p-type GaInP intermediate layer 5 and p-type GaAs cap layer 6. Thus, a current blocking structure is formed. Formed on the p-type GaAs cap layer 6 and the n-type GaAs current blocking layer 8 is a p-side electrode 9 made of Ti/Pt/Au, for example. On the other hand, an n-side electrode 10, made of AuGe/Ni/Au, for example, is formed on the bottom surface of the n-type GaAs substrate 1.

Figure 2B:
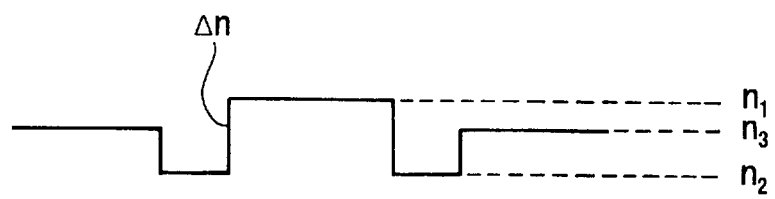

FIG. 2B is a schematic diagram showing distribution of refractive indices of the AlGaInP-based self-pulsation semiconductor laser, taking distribution of transverse refractive indices of the self-pulsation semiconductor laser in correspondence with FIG. 2A.

As shown in FIG. 2B, the self-pulsation semiconductor laser has a refractive index $n_1$ in the stripe portion 7, refractive index $n_2$, lower than $n_1$, in portions at both sides of the stripe portion 7, and refractive index $n_3$, higher than $n_2$ and lower than $n_1$, in portions outside them. The region with the refractive index $n_1$ corresponds to the region 4a of the p-type AlGaInP cladding layer 4, the region with the refractive index $n_2$ to the region 4b, and the region with the refractive index $n_3$ to the region 4c, respectively. The refractive index $n_2$ can be controlled by changing the thickness $d_1$ of the region 4b of the p-type AlGaInP cladding layer 4, and the refractive index $n_3$ can be controlled by adjusting the thickness $d_2$ of region 4c of the p-type AlGaInP cladding layer 4.

In the self-pulsation semiconductor laser, transverse optical guidance is effected by varying the refractive index in the transverse direction as shown in FIG. 2B. Δn is the refractive index difference ($n_1-n_2$) between the region with the highest refractive index $n_1$ and the region with the lowest refractive index $n_2$. If the thickness $d_1$ of the p-type AlGaInP cladding layer 4 in the region 4b is small, then the refractive index difference Δn becomes larger than that of a conventional self-pulsation semiconductor laser. Even in this case, since the regions with the refractive index $n_3$ exist outside the regions with the refractive index $n_2$, light can disperse due to a pulling force of the regions with the refractive index $n_3$.

In order to ensure self-pulsated oscillation of the self-pulsation semiconductor laser, it is necessary that the width of the optical guide region be larger than the width of the gain region inside the GaInP active layer 3 during operation of the semiconductor laser to ensure a sufficient area of the saturable absorbing region. According to the knowledge of the Inventor, the optical field confined in the saturable absorbing region is preferably more than 30% of the entire optical field.

To realize it, the self-pulsation semiconductor laser is configured so that the thickness $d_1$ in its region 4b and the thickness $d_2$ in its region 4c satisfy the relation of $0<d_1<d_2$ and the thickness $d_1$ in its region 4b be small enough to effectively suppress transverse extension of the electric current. Also, the width $W_2$ of the region 4b of the p-type AlGaInP cladding layer 4 is determined to be not smaller than 0.1 μm and not larger than 5 μm. The width $W_2$ of the region 4b is preferably not smaller than 1 μm and not larger than 3 μm, and more preferably not smaller than 1 μm and not larger than 2 μm. In an example of structural parameters of the self-pulsation semiconductor laser, the width $W_1$ of the region 4a (width of the stripe) is 4 μm, the width $W_2$ of the region 4b is 2 μm, and the thickness of the region 4b of the p-type AlGaInP cladding layer 4 is 0.3 μm.

Next explained are behaviors of the AlGaInP-based self-pulsation semiconductor laser having the above-explained structure.

During operation of the self-pulsation semiconductor laser, an electric current flows in the stripe portion 7. However, since the thickness $d_1$ of the region 4b of the p-type AlGaInP cladding layer 4 is sufficiently small, the current is permitted to flow only in a limited region, namely, substantially the region 4a. Therefore, transverse extension of the current is suppressed to approximately the width $W_1$ of the region 4a of the p-type AlGaInP cladding layer 4. On the other hand, transverse extension of light is controlled by the specific distribution of refractive indices (see FIG. 2B) made in the transverse direction, and light is extended with the aid of the pulling force of the regions with the refractive index $n_3$. As a result, transverse extension of light is larger than the width $W_1$ of the region 4a of the p-type AlGaInP cladding layer 4.

More specifically, during operation of the AlGaInP-based self-pulsation semiconductor laser, the current confining region and the light confining region are different in the transverse direction, and, as shown in FIG. 2, the transverse width $W_G$ of the gain region 11 inside the GaInP active layer 3 is smaller than the transverse width $W_P$ of the optical guide region 12. Then, the optical guide region 12 outside the gain region 11 functions as the saturable absorbing region 13. In this case, the saturable absorbing region 13 occupies 30% or more of the optical guide region 12 inside the GaInP active layer 3, and self-pulsated oscillation is stabilized.

Principles of self-pulsated oscillation are explained below with reference to FIGS. 3A through 3C which schematically show a main part (n-type AlGaInP cladding layer 2, GaInP active layer 3 and p-type AlGaInP cladding layer 4) of the self-pulsation semiconductor laser for simplicity.

During operation of the self-pulsation semiconductor laser, transverse extension of the current is controlled by the structure for permitting the current to flow in a limited region of the p-type AlGaInP cladding layer 4, and light is guided by the transversely different refractive indices. As a result, the width of the optical guide region 12 becomes larger than the width of the gain region 11 inside the GaInP active layer 3. In the status shown in FIG. 3A, since the width of the optical guide region 12 is sufficiently larger than the width of the gain region 11 inside the GaInP active layer 3, and causes the saturable absorbing region 13 to function as a diaphragm, laser oscillation is suppressed. In this case, weak LED light by spontaneous emission is released from the emitting end surface.

Figure 3A:
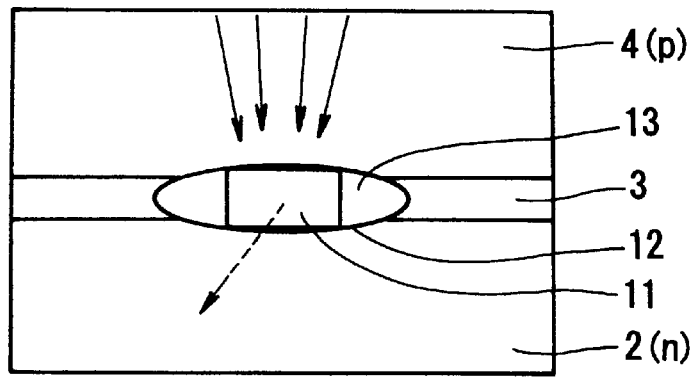
FIGS. 3A, 3B and 3C are cross-sectional views for explaining the principle of self-pulsated oscillation.
Figure 3B:
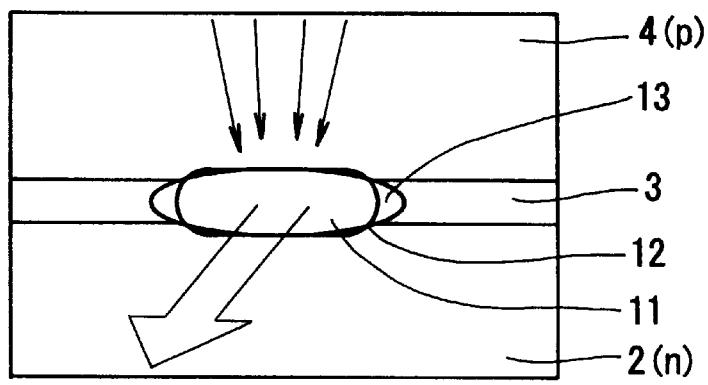

While laser oscillation is suppressed, carriers gradually accumulate in the GaInP active layer 3, and the gain region 11 expands beyond the current-injected region inside the GaInP active layer 3, as shown in FIG. 3B. Accordingly, the saturable absorbing region 13 inside the GaInP active layer 3 contracts. In the status shown in FIG. 3B, the optical gain in the gain region 11 is sufficiently high, and laser oscillation by induced emission begins.

When laser oscillation begins, carriers are consumed in the GaInP active layer 3. As a result, as shown in FIG. 3C, the gain region 11 in the GaInP active layer 3 becomes narrower than the current injected region. Accordingly, the saturable absorbing region 13 expands. Also in the status shown in FIG. 3C, laser oscillation is suppressed.

Figure 3C:
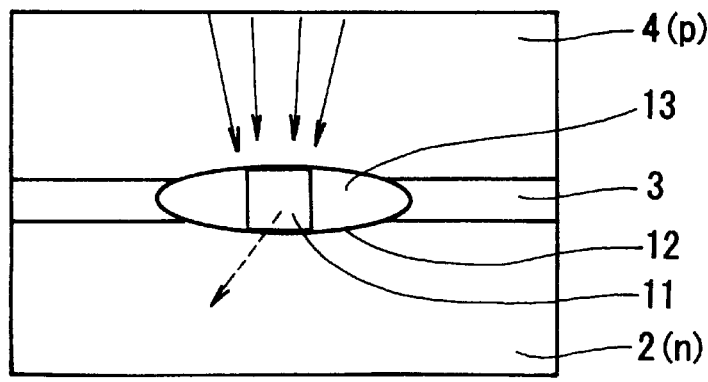

In case of the self-pulsation semiconductor laser, self-pulsated oscillation is realized by repeating the states shown in FIGS. 3A through 3C at a frequency of 500 MHz to 1 GHz and by varying laser optical outputs in form of pulses.

To fabricate the self-pulsation semiconductor laser, first grown on the n-type GaAs substrate 1 are, in sequence, the n-type AlGaInP cladding layer 2, GaInP active layer 3, p-type AlGaInP cladding layer 4, p-type GaInP intermediate layer 5 and p-type GaAs cap layer 6, by metal-organic chemical vapor deposition (MOCVD), for example. Then, a resist pattern of a predetermined mapping (not shown) is formed on the p-type GaAs cap layer 6. Using the resist pattern as an etching mask, the p-type GaAs cap layer 6, p-type GaInP intermediate layer 5 and p-type AlGaInP cladding layer 4 are selectively removed by wet etching using an etchant based on bromic acid, for example, up to a depth reaching a middle depth of the p-type AlGaInP cladding layer 4. As a result, the upper portion of the p-type AlGaInP cladding layer 4, p-type GaInP intermediate layer 5 and p-type GaAs cap layer 6 are patterned into a stripe of a predetermined width extending in one direction (the stripe portion 7 is formed), and depressed portions are formed in the p-type AlGaInP cladding layer 4 at both sides of the stripe portion 7.

After that, using the same resist pattern as a growth mask, the n-type GaAs current blocking layer 8 is formed at both sides of the stripe portion 7. Subsequently, after the resist pattern is removed, the p-side electrode 9 is formed on the p-type GaAs cap layer 6 and the n-type GaAs current blocking layer 8, and the n-side electrode 10 is formed on the bottom surface of the n-type GaAs substrate 1.

Thus, the intended AlGaInP-based self-pulsation semiconductor laser is completed.

The AlGaInP-based self-pulsation semiconductor laser having the above-described construction attains the following effects.

In the self-pulsation semiconductor laser, transverse extension of light is controlled by the built-in distribution of different refractive indices in the transverse direction. In this case, since it has the highest refractive index $n_1$ in the stripe portion 7 (the region corresponding to the region 4a of the p-type AlGaInP cladding layer 4), the lowest refractive index $n_2$ at both sides of the stripe portion 7 (the regions corresponding to the regions 4b of the p-type AlGaInP cladding layer 4), and the intermediate refractive index $n_3$ between $n_1$ and $n_2$ at portions outside them (portions corresponding to the regions 4c of the p-type AlGaInP cladding layer 4), light from the GaInP active layer 3 extends with the aid of a pulling force of the regions with the refractive index $n_3$. Therefore, transverse extension of light becomes larger than the width $W_1$ of the region 4a of the p-type AlGaInP cladding layer 4. On the other hand, due to the current blocking structure, transverse extension of electric current is suppressed to approximately the width $W_1$ of the region 4a of the p-type AlGaInP cladding layer 4.

In this manner, current and light can be confined transversely in different regions, and current confinement and light confinement can be controlled independently. More specifically, in case of the self-pulsation semiconductor laser, transverse extension of electric current is controlled by the thickness $d_1$ of the region 4b of the p-type AlGaInP cladding layer 4, and transverse extension of light is controlled by the width $W_2$ of the region 4b of the p-type AlGaInP cladding layer 4 and the thickness $d_2$ of the region 4c of the p-type AlGaInP cladding layer 4. Therefore, the width $W_G$ of the gain region 11 and the width $W_P$ of the optical guide region 12 inside the GaInP active layer 3 can be controlled independently, a sufficient area of the saturable absorbing region 13 (30% or more of the optical guide region 12) can be ensured reliably, and self-pulsated oscillation is stabilized. As a result, the yield of semiconductor lasers acceptable for is improved.

Although conventional self-pulsation semiconductor lasers involved the problem that extension of electric current becomes large upon an increase in temperature or injected current during operation at a high temperature or for a high output, the self-pulsation semiconductor laser according to the embodiment can suppress extension of electric current caused by an increase in temperature or injected current can be restricted by decreasing the thickness $d_1$ of the region 4b of the p-type AlGaInP cladding layer 4 as small as approximately 0.3 µm, for example. Moreover, this mode of control does not result in preventing self-pulsated oscillation because extension of light can be controlled independently using other structural parameters (width $W_2$ of the region 4b of the p-type AlGaInP cladding layer 4 and thickness $d_2$ of the region 4c). Therefore, according to the self-pulsation semiconductor laser explained here, self-pulsated oscillation stable even in operation at a high temperature can be realized, and the maximum output by self-pulsated oscillation can be improved.

Additionally, conventional self-pulsation semiconductor lasers had drawbacks for applications as a light source of, in particular, an optical disc device, because of the problem that the horizontal radiation angle θ// of laser light for far field pattern varies with operation temperature, output, or other factors, due to the transverse index-guided property being weak. However, the self-pulsation semiconductor laser according to the embodiment can make an intensive index-guided property in the transverse direction, it can be operated, stabilizing θ// even when self-pulsated oscillation occurs.

Figure 4A:
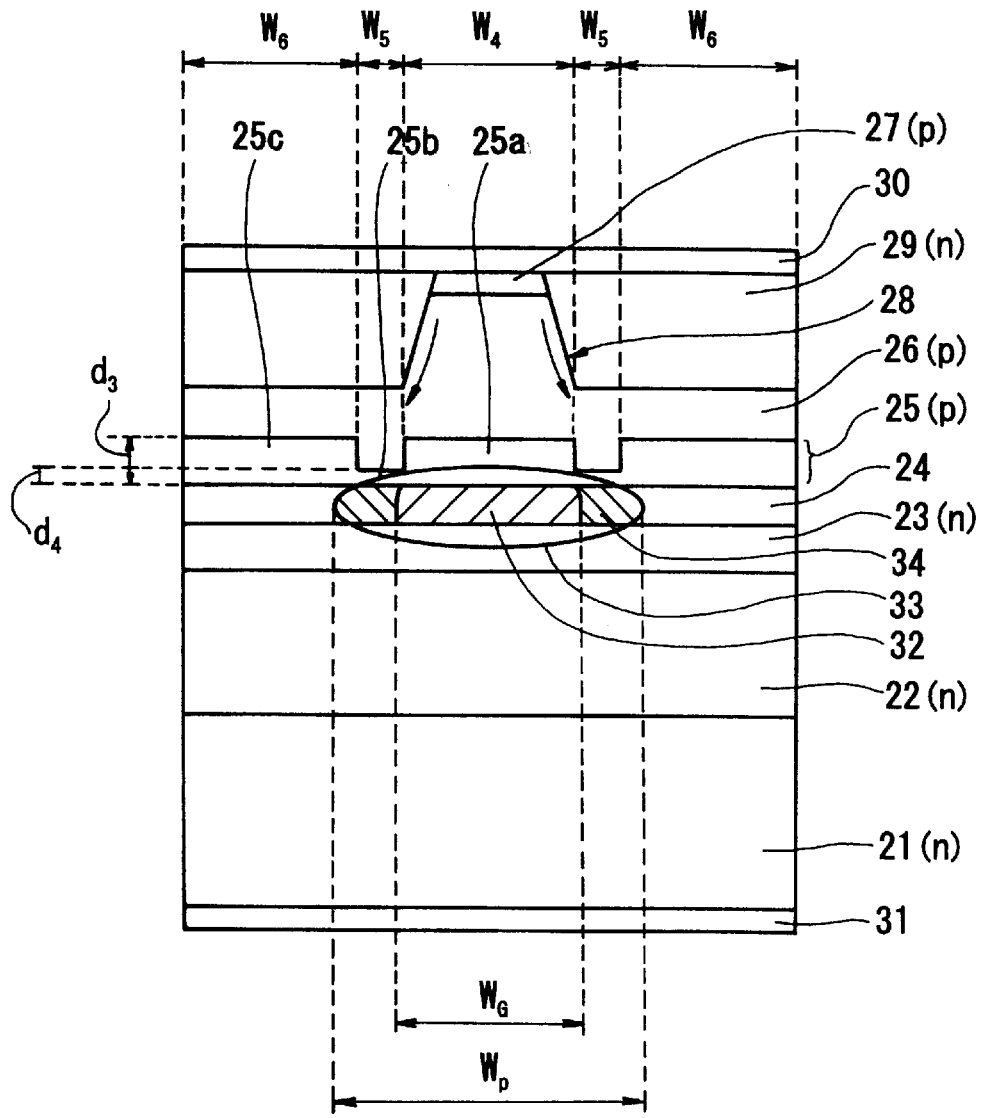
FIGS. 4A and 4B are a cross-sectional view showing an AlGaInP-based self-pulsation semiconductor laser according to the second embodiment of the invention and a schematic diagram showing distribution of refractive indices of the self-pulsation semiconductor laser.

Next explained is the second embodiment of the invention. FIG. 4A is a cross-sectional view of a self-pulsation semiconductor laser taken as the second embodiment. The self-pulsation semiconductor laser taken here has a separate confinement heterostructure (SCH) made of AlGaAs-based materials.

As shown in FIG. 4A, the AlGaAs-based self-pulsation semiconductor laser includes an n-type $Al_{0.45}Ga_{0.55}As$ cladding layer 22, n-type $Al_{0.3}Ga_{0.7}As$ optical guide layer 23, $Al_{0.12}Ga_{0.88}As$ active layer 24, p-type $Al_{0.3}Ga_{0.7}As$ optical guide layer 25, p-type $Al_{0.45}Ga_{0.55}As$ cladding layer 26 and p-type GaAs cap layer 27 sequentially stacked on an n-type GaAs substrate 21. An upper layer of the p-type $Al_{0.45}Ga_{0.55}As$ cladding layer 26 and the p-type GaAs cap layer 27 have the form of a stripe extending in one direction.

Numeral 28 denotes the stripe portion made of the p-type $Al_{0.45}Ga_{0.55}As$ cladding layer 26 and the p-type GaAs cap layer 27. The stripe portion has a mesa-type cross-sectional configuration.

In this case, the p-type $Al_{0.3}Ga_{0.7}As$ optical guide layer 25 has depressed portions at both sides of the portion underlying the stripe portion 28. Numeral 25a denotes a region of the optical guide layer 25 underlying the stripe portion 28, and 25b denotes regions adjacent both sides of the region 25a, in which the depressed portions are formed. Numeral 25c denotes regions outside the regions 25b as viewed from the center portion of the light emitting.

Dimensions $W_4$, $W_5$ and $W_6$ are transverse widths of the regions 25a, 25b and 25c of the p-type $Al_{0.3}Ga_{0.7}As$ optical guide layer 25. Dimension $d_3$ is the thickness of the regions 25a and 25c of the p-type $Al_{0.3}Ga_{0.7}As$ optical guide layer 25, and dimension $d_4$ is the thickness of the region 25b of the p-type $Al_{0.3}Ga_{0.7}As$ optical guide layer 25. In this case, the thickness $d_4$ of the region 25b of the p-type $Al_{0.3}Ga_{0.7}As$ optical guide layer 25 is smaller than the thickness $d_3$ of the regions 25a and 25c (where $0<d_4<d_3$). That is, the p-type $Al_{0.3}Ga_{0.7}As$ optical guide layer 25 has depressed portions at both sides of the region (region 25a) underlying the stripe portion 28, and the region containing the depressed portions (region 25b) is thinner than the other regions (regions 25a and 25c).

An n-type GaAs current blocking layer 29 is stacked to fill both sides of the stripe portion 28 made of the upper layer of the p-type $Al_{0.45}Ga_{0.55}As$ cladding layer 26 and the n-type GaAs cap layer 27 to form a current blocking structure. A p-side electrode 30 made of Ti/Pt/Au, for example, is formed on the p-type GaAs cap layer 27 and the n-type GaAs current blocking layer 29. An n-side electrode 31 made of AuGe/Ni/Au, for example, is formed on the bottom surface of the n-type GaAs substrate 21.

Figure 4B:

FIG. 4B is a schematic diagram showing distribution of refractive indices of the AlGaAs-based self-pulsation semiconductor laser, taking transverse distribution of refractive indices thereof in correspondence with FIG. 4A.

As shown in FIG. 4B, the self-pulsation semiconductor laser has a refractive index $n_4$ in the stripe portion 28, a refractive index $n_5$ lower than $n_4$ at both sides of the stripe portion 28, and a refractive index equal to $n_4$ of the stripe portion 28 at portions outside them. In this case, the region with the refractive index $n_4$ in the center of the stripe portion 28 corresponds to the region 25a of the p-type $Al_{0.3}Ga_{0.7}As$ optical guide layer 25, the region with the refractive index $n_5$ corresponds to the region 25b of the p-type $Al_{0.3}Ga_{0.7}As$ optical guide layer 25, and the outermost region with the refractive index $n_4$ corresponds to the region 25c of the p-type $Al_{0.3}Ga_{0.7}As$ optical guide layer 25. In this case, the refractive index $n_5$ can be controlled by adjusting the thickness $d_4$ of the region 25b of the p-type $Al_{0.3}Ga_{0.7}As$ optical guide layer 25.

In the self-pulsation semiconductor laser, the transverse distribution of refractive indices is structurally built in the p-type $Al_{0.3}Ga_{0.7}As$ optical guide layer 25, and the transverse optical guide mechanism has a rib-guided form by the p-type $Al_{0.3}Ga_{0.7}As$ optical guide layer 25. However, because different transverse indices are made to represent the distribution as shown in FIG. 4B, light can extend with the aid of a pulling force of the outermost regions with the refractive index $n_4$, instead of being strictly confined in the center of the stripe portion 28 due to the refractive index difference between $n_4$ near the stripe portion 28 and $n_5$ at both sides thereof.

To ensure self-excited oscillation of the self-pulsation semiconductor laser, it is necessary that the saturable absorbing region reliably grows sufficiently (30% or more of the optical guide region) inside the $Al_{0.12}Ga_{0.88}As$ active layer 24, like the first embodiment. To realize it, the width of each depressed portion in the p-type $Al_{0.3}Ga_{0.7}As$ optical guide layer 25, namely the width $W_5$ of the region 25b, is determined to be not less than 0.5 μm and not larger than 5 μm. Typically, the width $W_5$ of the region 25b may be not less than 1 μm and not more than 2 μm. The width $W_4$ of the region 25a may be 3 μm, the thickness $d_3$ of the regions 25a and 25c of p-type $Al_{0.3}Ga_{0.7}As$ optical guide layer 25 may be 400 nm, and the thickness $d_4$ of the region 25b may be 300 nm.

During operation of the self-pulsation semiconductor laser having the above-explained structure, transverse extension of electric current is controlled by the stripe portion made of the upper-lying portion of the p-type $Al_{0.45}Ga_{0.55}As$ cladding layer 26 and the p-type GaAs cap layer 27 to form a mesa-type cross-sectional configuration. Transverse extension of light is controlled independently from extension of electric current by the built-in transverse distribution of refractive indices (see FIG. 4B). In this case, transverse extension of electric current is restricted approximately to the width of the stripe portion 28 whereas transverse extension of light becomes larger than the width $W_4$ of the region 25a of the p-type $Al_{0.3}Ga_{0.7}As$ optical guide layer 25, namely the width of the stripe portion 28. Therefore, the width $W_G$ of the gain region 32 inside the $Al_{0.12}Ga_{0.88}As$ active layer 24 becomes smaller than the width $W_P$ of the optical guide region 33. Then, the optical guide region 33 outside the gain region 32 behaves as the saturable absorbing region 34, and self-excited oscillation is realized.

According to the invention, electric current confinement and light confinement occur in transversely different regions, and extension of current and extension of light in the transverse direction can be controlled independently. Therefore, according to the second embodiment, the same effects as those of the first embodiment can be obtained in the AlGaAs-based SCH-structured self-pulsation semiconductor laser.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

Additionally, the invention is applicable to self-pulsation semiconductor lasers for emitting blue light, made by using II–VI compound semiconductors or nitride-based III–V compound semiconductors.

As described above, according to the invention, distribution of refractive indices in a direction parallel to the p-n junction and normal to the cavity lengthwise direction includes a first index portion having a first refractive index in the stripe portion, a second index portion having a second refractive index lower than the first refractive index at both sides of the stripe portion, and a third index portion having a third refractive index not larger than the first refractive index and higher than the second refractive index outside the second index portion. Therefore, light from the active layer is pulled by the third index portion and can extend sufficiently, instead of being strictly confined in the first index portion. As a result, extension of light in the direction parallel to the p-n junction and normal to the cavity lengthwise direction becomes larger than the width of the stripe. On the other hand, due to the current blocking structure, extension of electric current in the direction parallel to the p-n junction and normal to the cavity lengthwise direction is restricted approximately to the width of the stripe. Therefore, the width of the gain region inside the active layer becomes smaller than the width of the optical guide region, and the optical guide region outside the gain region behaves as the saturable absorbing region. In this case, since current confinement and light confinement in the direction parallel to the p-n junction and normal to the cavity lengthwise direction can be effected independently, the saturable absorbing region can be reliably grown sufficiently.

As a result, the yield of products is improved when manufacturing self-pulsation semiconductor lasers, and self-excited oscillation is stabilized even during operation at a high temperature or for a high output.

What is claimed is:

1. A self-pulsating semiconductor laser having a refractive index distribution in a direction parallel to a p-n junction thereof and normal to the cavity lengthwise direction thereof, comprising:

a substrate;

a first cladding layer formed on said substrate;

an active layer formed on said first cladding layer;

a second cladding layer formed on said active layer;

said second cladding layer including a mesa-type stripe portion extending above the remainder of said second cladding layer, and a current blocking layer formed on both sides of said mesa-type stripe portion, said refractive index distribution including a first refractive index portion having a first refractive index in said stripe portion, a second refractive index portion having a second refractive index lower than said first refractive index at both sides of said stripe portion, and a third refractive index portion having a third refractive index not higher than said first refractive index and higher than said second refractive index outside of said second refractive index portion.

2. The self-pulsating semiconductor laser according to claim 1 wherein said second refractive index portion is thinner than said third refractive index portion in a direction normal to the p-n junction.

3. The self-pulsating semiconductor laser according to claim 1 wherein said second refractive index portion has a width parallel to the p-n junction which is not less than 0.1 μm and less than 5 μm.

4. The self-pulsating semiconductor laser according to claim 1 further comprising an optical guide layer between said active layer and said second cladding layer, said optical guide layer having depressed portions at both sides of said mesa-type stripe portion.

5. The self-pulsating semiconductor laser according to claim 1 wherein said current blocking layer is opposite from said second cladding layer in conduction type.

6. The self-pulsating semiconductor of claim 2 wherein said second cladding layer is configured to have depressions on opposite sides of said mesa-type stripe portion within said second refraction index portion, the thickness of said second cladding in said depression being $d_1$, the thickness of said second cladding layer within said third refraction index portion being $d_2$, $d_1$ and $d_2$ satisfying the relation $0 < d_1 < d_2$ and $d_1$ being small being to effectively suppress transverse extension of the electric current in the active layer.

7. The self-pulsating layer of claim 4 wherein said second refractive index portion is thinner than said third refractive index portion in a direction normal to the p-n junction.

8. The self-pulsating semiconductor of claim 7 wherein said guide layer is configured to have depressions on opposite sides of said mesa-type stripe portion within said second refraction index portion, the thickness of said guide layer in said depressions being $d_4$, the thickness of said guide layer within said third refraction index portion being $d_3$, said $d_3$ and $d_4$ satisfying the relation $0<d_4<d_3$ and $d_4$ being small being to effectively suppress transverse extension of the electric current in the active layer.

* * * * *